(12) United States Patent  
Agneray et al.

(10) Patent No.: US 7,710,104 B2
(45) Date of Patent: May 4, 2010

(54) OUT-OF-LINE MEASUREMENT OF A CURRENT FLOWING THROUGH A LOAD

(75) Inventors: Andre Agneray, Boulogne sur Seine (FR); Clement Nouvel, Verneuil sur Seine (FR)

(73) Assignee: Renault s.a.s., Boulogne Billancourt (FR)

( * ) Notice: Subject to any disclaimer, the term of this patent is extended or adjusted under 35 U.S.C. 154(b) by 0 days.

(21) Appl. No.: 12/095,269

(22) PCT Filed: Oct. 19, 2006

(86) PCT No.: PCT/FR2006/051066

§ 371 (c)(1),
(2), (4) Date: Aug. 22, 2008

(87) PCT Pub. No.: WO2007/060347

PCT Pub. Date: May 31, 2007

(65) Prior Publication Data

US 2008/0315864 A1    Dec. 25, 2008

(30) Foreign Application Priority Data

Nov. 28, 2005   (FR) ................................. 05 12039

(51) Int. Cl.
*G01R 15/08* (2006.01)
*G01R 7/00* (2006.01)
*H01F 17/04* (2006.01)

(52) U.S. Cl. .................... 324/127; 324/142; 324/158.1; 336/172

(58) Field of Classification Search ...... 324/117 R–142, 324/127, 158.1; 336/172
See application file for complete search history.

(56) References Cited

U.S. PATENT DOCUMENTS 3,968,432 A * 7/1976 Kelley, Jr. .................... 324/107
4,293,813 A * 10/1981 Groenenboom ......... 324/117 R
4,495,463 A * 1/1985 Milkovic .................... 324/142
5,150,039 A * 9/1992 Avocat ....................... 324/127

FOREIGN PATENT DOCUMENTS

EP          0 825 343        2/1998
EP          1 515 408        3/2005

\* cited by examiner

*Primary Examiner*—Ha Tran T Nguyen
*Assistant Examiner*—Emily Y Chan
(74) *Attorney, Agent, or Firm*—Oblon, Spivak, McClelland, Maier & Neustadt, L.L.P.

(57) ABSTRACT

A load measuring circuit including a cable including first and second conductors and a shielding. The conductors are connected by a first end thereof to a load, the shielding is not connected to a ground at the end, and the conductors are connected to a generator by the second end thereof. A transformer includes a first winding connected to a conductor on the second end of the cable, a second winding is connected between a ground and the shielding on the second end of the cable, and a third winding is connected to a current measuring member.

9 Claims, 2 Drawing Sheets

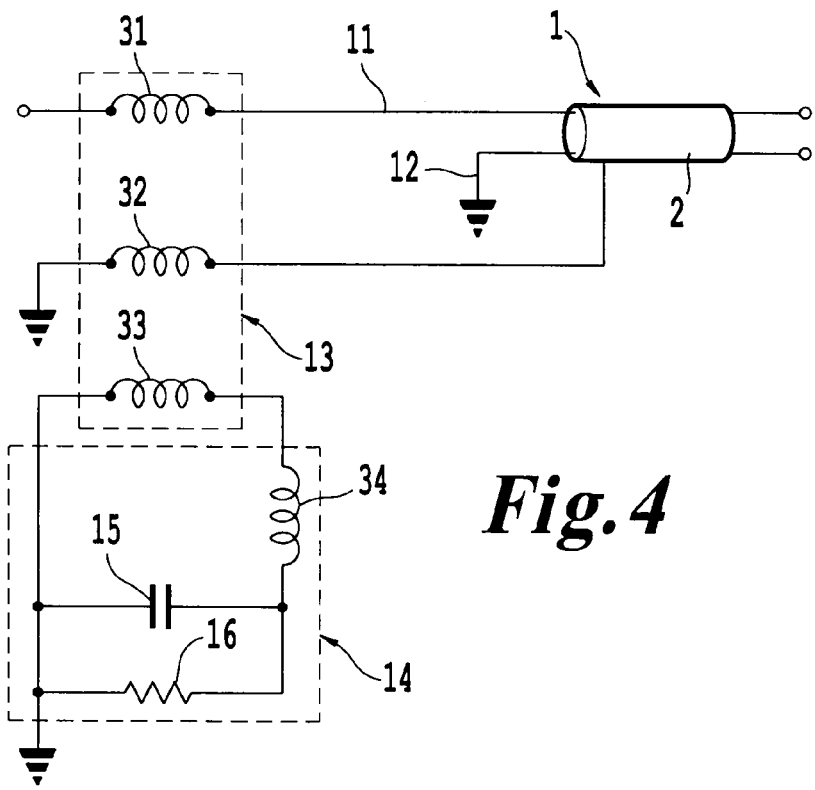
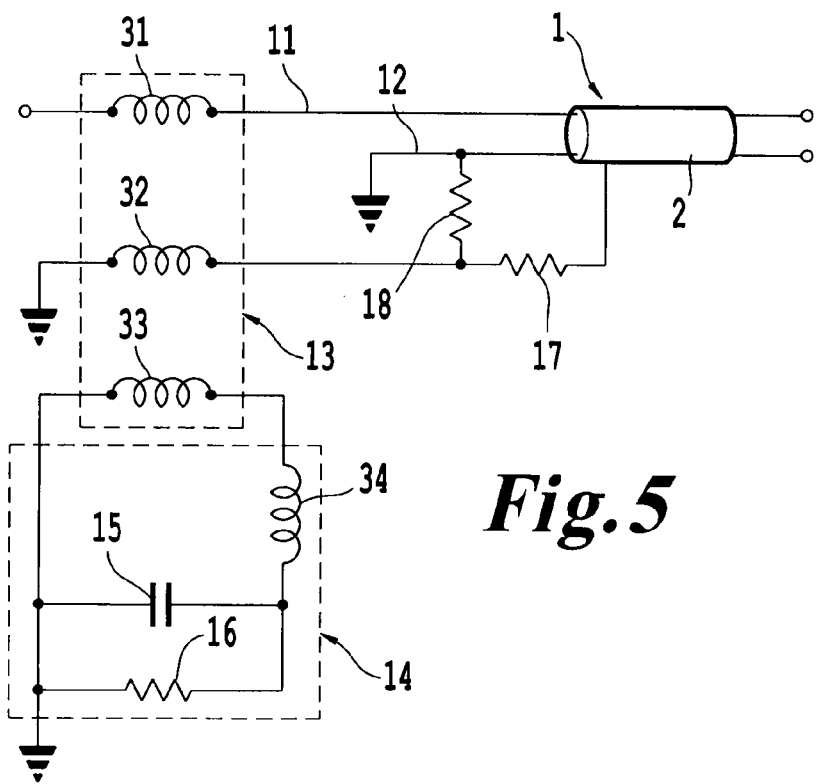

OUT-OF-LINE MEASUREMENT OF A CURRENT FLOWING THROUGH A LOAD

BACKGROUND OF THE INVENTION

1. Field of Invention

The invention relates to the supply of power to resonant loads with voltages greater than 300 V and at frequencies higher than 1 MHz, and in particular to measurements of the current flowing through such loads.

2. Discussion of the Background

Especially for application to automobile plasma ignition, resonators whose resonant frequency is higher than 1 MHz are arranged at the spark plug and are typically supplied with voltages greater than 300 V and are subjected to a current greater than 5 A. This application necessitates the use of radio-frequency resonators with a high quality factor and a high voltage generator, the operating frequency of which is very close to the resonant frequency of the resonator. The more the difference between the resonant frequency of the resonator and the operating frequency of the generator is reduced, the higher the amplification factor of the resonator (ratio of its output voltage to its input voltage) of the resonator. The higher the quality factor, the closer the operating frequency of the generator must be to its resonant frequency.

Numerous parameters have an impact on the resonant frequency: manufacturing tolerances, temperature in the combustion chamber or in the cooling circuit, or aging drift in the resonator components. The evolution of the resonant frequency is thus difficult to foresee or to control.

Servocontrol techniques allow a supply voltage to be kept at a frequency close to the resonant frequency of the resonator. One technique consists in particular in making current and voltage measurements while supplying power to the resonator. Measurement of the phase angle between the current and voltage of the resonator output allows the servocontrol to be carried out.

As shown in FIG. 1, a known device comprises a cable 1 connecting the generator to a resonator 3. The cable 1 comprises conductors 8 and a shield 2. The resonator 3 comprises an inductor 4, a capacitor 5 and a resistor 6. In order to limit the number of conductors between the resonator and the generator, a current measuring device is positioned at the generator. However, the cable 1 introduces parasitic capacitances, illustrated by the capacitor 7 in the equivalent electrical circuit of FIG. 1. Leakage currents then appear in the cable and strongly modify the waveform of the current measured at the generator output.

As illustrated in FIG. 2, the measurement signal 22 at the generator output is phase-shifted relative to the current 21 at the resonator input 3. In addition, this signal 22 is influenced by high-frequency parasitic resonances due to coupling between the resonator and the parasitic capacitances of the cable 1. The performance of the servocontrol is then strongly reduced. No known solution allows the precision of the measurement signal at the generator to be improved for such frequency values.

SUMMARY OF THE INVENTION

The invention aims to eliminate one or several of these drawbacks. The invention thus proposes a circuit for measuring the current flowing through a load, comprising:

a cable having, between the first and second ends, first and second conductors and a shield, the conductors being able to be connected to a load at the first end and to a generator at the second end, the shield not being connected to ground at the first end; and a transformer having at least first, second and third windings, the first winding being connected to a conductor at the second end of the cable, the second winding being connected between ground and the shield at the second end of the cable, the third winding being able to be connected to a current measuring device.

BRIEF DESCRIPTION OF THE DRAWINGS

Other features and advantages of the invention will clearly emerge from the description below, by way of indication and in no way limiting, with reference to the appended drawings in which:

FIG. 4 illustrates a connection cable and a measurement device according to an embodiment of the invention; and FIG. 5 illustrates a connection cable and a measurement device according to a variant of the invention.

DESCRIPTION OF THE PREFERRED EMBODIMENTS

The invention proposes measuring the current delivered into a resonant load by means of a shielded cable. The measurement is carried out at the connection of the cable to a generator, by means of a three-winding transformer. The currents flowing through the shield of the cable are used, these currents being proportional to the parasitic capacitances of the cable. One of the transformer windings recovers the currents flowing through the shield in order to compensate at a measurement device for the leakages due to the parasitic capacitances of the cable.

In this way, precise measurement of the current delivered into the resonant load can be carried out without necessitating a measurement probe at the load and an additional cable to conduct this signal to the generator.

Figure 1:
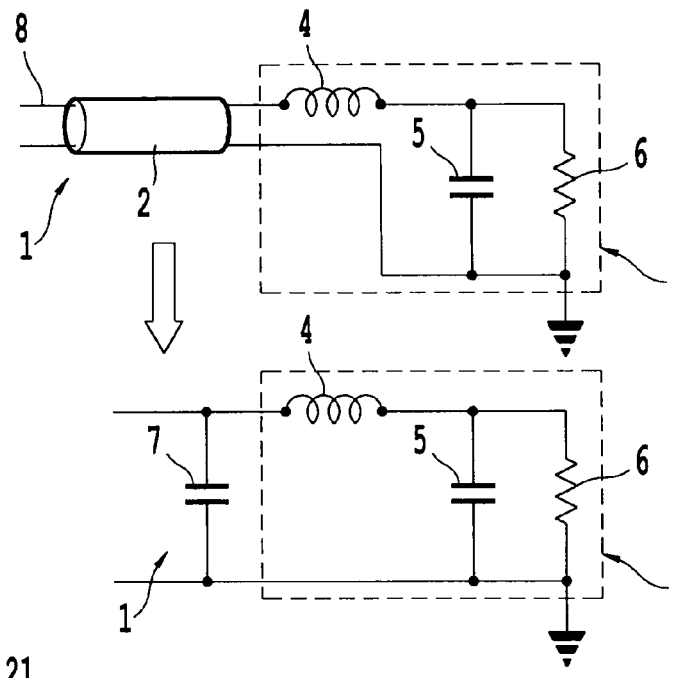
FIG. 1 illustrates the connection of a resonator by means of a cable and its electrical equivalent.
Figure 2:
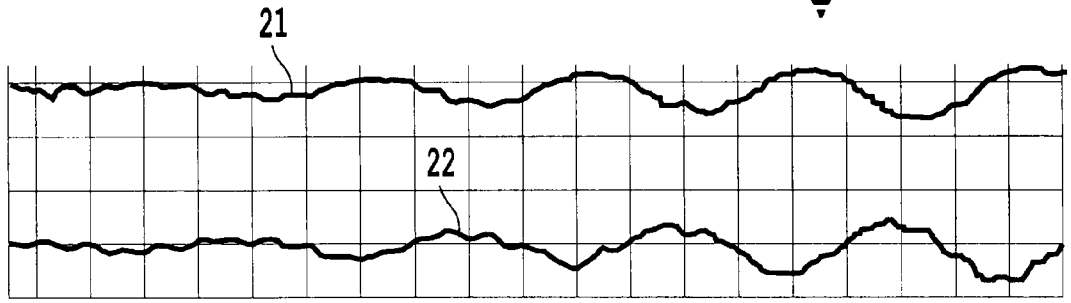
FIG. 2 illustrates the resonator input current and the signal measured at the generator.
Figure 3:
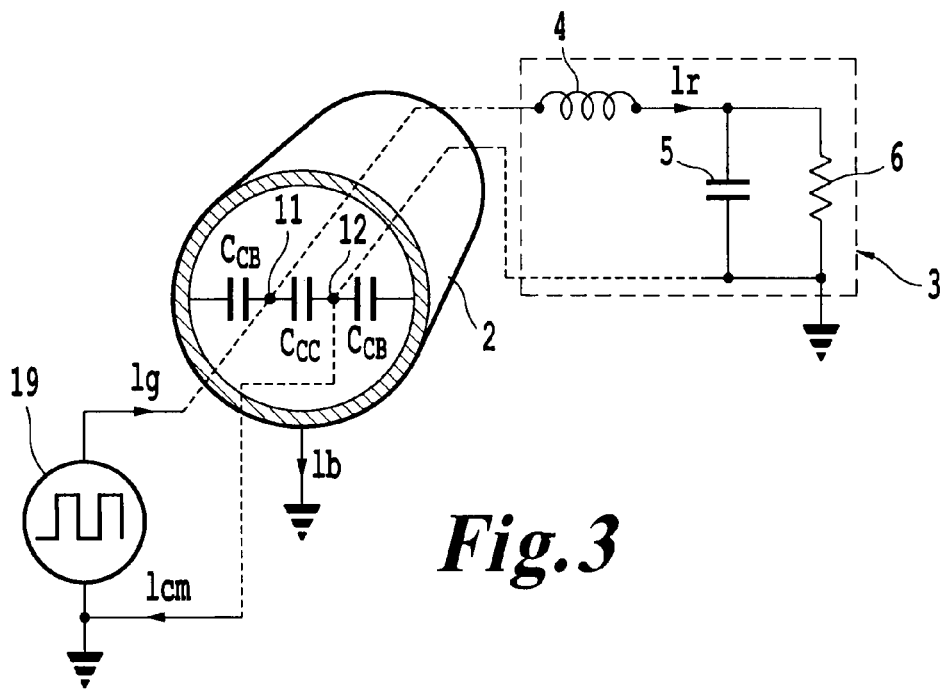
FIG. 3 illustrates the parasitic capacitances and currents in a connection cable.

FIG. 3 illustrates a cable 1 connected at a first end to a resonator 3 and connected at a second end to a generator 19. The cable 1 comprises a first conductor 11 connected to a high-voltage terminal of the generator 19, a second conductor 12 connected to ground, and a shield. The generator is able to deliver a supply voltage at a frequency higher than 1 MHz, the resonant frequency of the resonator also being higher than 5 MHz.

The capacitances $Ccb$ are derived from the per-unit-length capacitances of each conductor 11 and 12 in relation to the shielding. The capacitance $Ccc$ is derived from the per-unit-length capacitance between the conductors 11 and 12. By considering that the wavelengths are very large in relation to the length of the cable (for a cable designed for automobile ignition, the length of the cable will generally be between 100 and 1500 mm), the following equations are deduced therefrom:

$$Ig = Icm + Ib$$

$$Icm = Ir + Icc$$

$$Ib = Icb = Icc \times Ccc/Ccb$$

$$Ir = Icm - Icc = Ig - Ib \times Ccb/Ccc - Ib = Ig - (1 + Ccb/Ccc) \times Ib$$

with Ig being the current delivered by the generator into the conductor 11, Icm the current leaving the conductor 12 at the second end of the cable, Ib the current between the shield and ground, Ir the current injected at the resonator input, Icc the current in the capacitances Ccc, and Icb the current in the capacitances Ccb.

The relation Ig=Icm+Ib means that there is no current circulating from the cap of the spark plug directly to ground. This result is obtained, for example, by adding a magnetic circuit surrounding the conductors in which the currents Ig, Icm and Ib flow upstream of the connector. This result may also be obtained by adding a ferrite ring around the cable.

FIG. 4 illustrates an embodiment of a measurement circuit according to the invention, using the current Ib to correct a current measurement made at the second end of the cable. The measurement circuit comprises a cable 1 as previously detailed and a three-winding transformer 13. In particular a shielded twisted-pair cable may be used. The conductors 11 and 12 are intended to be connected to the resonator at a first end of the cable and to the generator at a second end of the cable.

The first winding 31 of the transformer 13 is intended to be connected between a high-voltage output of a generator and the conductor 11 at the second end of the cable 1. The current flowing through the winding 31 is the sum of the current flowing through the resonator and the currents induced by the parasitic capacitances of the cable 1. The second winding 32 of the transformer is connected between a ground and the shield 2 at the second end of the cable. The shield 2 is not electrically connected at the first end of the cable. Flowing through the second winding 32 is a current representing the currents induced by the parasitic capacitances of the cable. The third winding 33 is connected to the terminals of a current measuring device 14, typically an RC circuit. The measuring device 14 illustrated comprises a capacitor 15 and a resistor 16. The inductor 34 represents the leakage inductance of the transformer.

The winding 33 serves to carry out the current measurement in a manner known per se. The windings 31 and 32 are wound in opposing directions in order that the current Ib compensates for the difference between the current Ig and the current Ir in the measured signal. The current flowing through the third winding 33 is thus more representative of the current Ir flowing through the resonator.

To form a power supply device for a resonator with a frequency control circuit, a generator equipped with a frequency control device recovering the measurement signal provided by the measuring device 14 is put alongside the measurement circuit. In a manner known per se, the servocontrol device modifies the frequency of the supply voltage as a function of this measurement signal, for example by first determining the phase between the measurement signal and the supply voltage.

This power supply device is advantageously used to form a plasma generation system with a resonator supplying two electrodes. The power supply device may also supply a resonator having a frequency higher than 1 MHz, a plasma being formed between these two electrodes in the presence of the supply voltage. The resonator may in particular be a spark plug coil of an automobile ignition.

FIG. 5 illustrates another variant of the measurement circuit optimizing the compensation and designed to obtain the desired compensation ratio without limitation by the number of turns of the winding 32. In this variant a resistive bridge diverts part of the current from the compensation bridge directly to ground. In the example illustrated, optimal compensation is obtained with appropriate values R17 and R18 of the resistive connections 17 and 18.

In fact calculations and measurement allow it to be deduced that, even using the same number of turns in the windings 31 and 32, compensation of the parasitic currents is not complete. This phenomenon can be explained by the difference between the per-unit-length capacitance between conductors and the per-unit-length capacitance between a conductor and the shield. In fact the ratio R18/(R17+R18) is approximately equal to the ratio Icb/(Icc+Icb) divided by the transformer ratio between the winding 31 and the winding 32. Assuming that the winding 32 is in fact split whereas the winding 31 is not, the compensation is exact only if the current Icc is equal to the current Icb, which is not verified due to differences in the per-unit-length capacitances. A resistance bridge is therefore used to adjust this ratio. The design of the resistance bridge can be carried out on the basis of the per-unit-length capacitances of the cable.

In order to optimize the compensation, it is also possible to adapt the number of turns of the winding 32 in relation to the winding 31 in an adequate manner.

Furthermore, the resistive connections 17 and 18 and the parasitic capacitances of the cable may reduce the bandwidth in the winding 32 by RC filtering, which may change the compensation at the frequencies of use. It will therefore be advantageous to include sufficient reactive components in the connections 17 and 18 in order to optimize the dynamic behavior of the measurement circuit.

The RC circuit is advantageously configured with the leakage inductance 34 such as to form a filter, the bandwidth of which is centered on the resonant frequency of the resonator, and in such a way that the voltage at the terminals of the resistor does not leave the voltage range of the servocontrol device.

The inductance of the winding 31 must not be too great in order not to affect the behavior of the open-loop power supply device. In practice, the transformer 13 may have a small sized toroid (outer diameter of around 20 mm), made of a magnetic material that preserves its properties at the operating frequency such as the ferrite 4C65. With a single-turn winding 31, the inductance may be limited to 30 nH. In order to limit the current flowing through the winding 33, the latter will preferably have a number of turns far greater than the number of turns of the winding 31, for example 20 turns in the preceding example.

The invention claimed is:

1. A circuit for measuring the current flowing through a load, comprising:
   a cable including, between first and second ends, first and second conductors and a shield surrounding the conductors, the conductors configured to be connected to a load at a first end and to a generator at a second end, the shield not being connected to ground at the first end;
   a transformer including at least first, second, and third windings, the first winding connected to a conductor at the second end of the cable, the second winding connected between ground and the shield at the second end of the cable, the third winding configured to be connected to a current measuring device.

2. The current measurement circuit as claimed in claim 1, wherein the current measuring device is connected to terminals of the third winding.

3. The current measurement circuit as claimed in claim 2, wherein the current measuring device includes an RC circuit.

4. A device for supplying power to a load, comprising:
   a current measurement circuit as claimed in claim 3;

a generator connected to the current measurement circuit by the first and second conductors at the second end of the cable and configured to provide the first and second conductors with a supply voltage at a frequency higher than 1 MHz, the generator comprising a frequency control circuit connected to the measuring device and modifying the frequency of the supply voltage as a function of the signal provided by the measuring device.

5. The power supply device as claimed in claim 4, in which the first winding is connected between a high-voltage output of the generator and the first conductor.

6. The power supply device as claimed in claim 5, in which the first and second windings are wound in opposing directions.

7. The power supply device as claimed in claim 5, further comprising a resistor connected between the shield and the second conductor at the second end.

8. The power supply device as claimed in claim 7, further comprising an active component connected between the shield and the second conductor at the second end.

9. A plasma generation system comprising:
a device as claimed in claim 5; and
a load having a resonant frequency higher than 1 MHz, connected to the conductors of the cable at the first end, comprising two electrodes and configured to generate a plasma between the two electrodes when the generator delivers its supply voltage.

* * * * *